United States Patent [19]

Gregory

[11] Patent Number: 4,650,695
[45] Date of Patent: Mar. 17, 1987

[54] METHOD OF FABRICATING SOLAR CELLS
[75] Inventor: James A. Gregory, Sudbury, Mass.
[73] Assignee: Mobil Solar Energy Corporation, Waltham, Mass.
[21] Appl. No.: 733,710
[22] Filed: May 13, 1985
[51] Int. Cl.[4] ............................................. B05D 3/06
[52] U.S. Cl. ................................... 427/38; 427/74.0; 427/256
[58] Field of Search ........................... 427/38, 74, 256

Primary Examiner—Bernard D. Pianalto
Attorney, Agent, or Firm—Schiller, Pandiscio & Kusmer

[57] ABSTRACT

An improvement to the process of passivation of polycrystalline silicon using a broad beam ion source wherein a controlled flow, greater in volume than the background level, of a low molecular weight hydrocarbon vapor is introduced into the vacuum system of the Kaufman-type ion source used for passivation. The amount of hydrocarbon introduced is between about one third of one percent and about ten percent, relative to the hydrogen flow, depending on the hydrocarbon. The process is especially advantageous in producing a passivated layer that functions adequately as a mask for metal plating.

12 Claims, 1 Drawing Figure

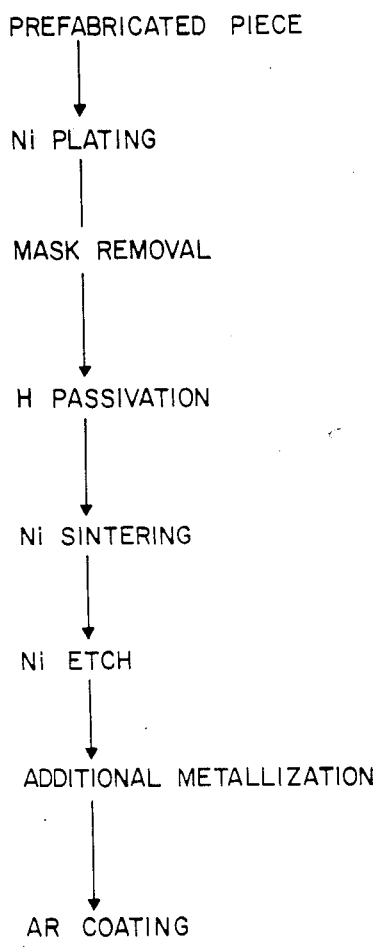
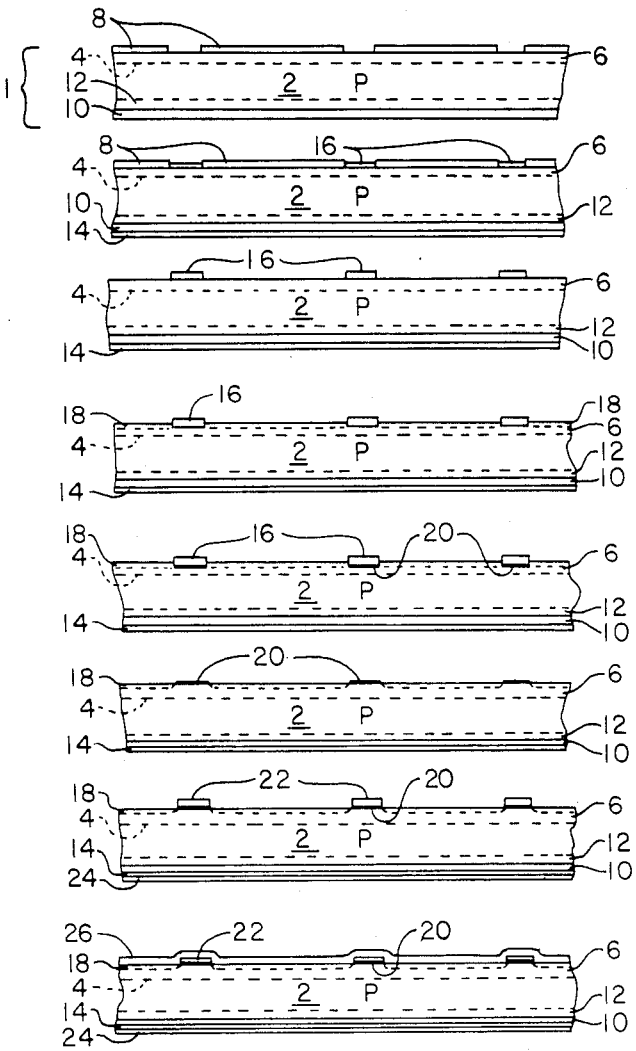

METHOD OF FABRICATING SOLAR CELLS

BACKGROUND OF THE INVENTION

This invention pertains to the manufacture of solid state electronic devices and more particularly to improvements in the method of fabricating polycrystalline silicon solar cells wherein the damaged surface layer generated during hydrogen passivation is used as a plating mask for the metallization of the front surface electrodes.

Heretofore a common method of fabricating silicon solar cells has included the steps of forming a PN junction by diffusing a suitable dopant into the front side of a silicon wafer or ribbon, etching a grid electrode pattern in a protective dielectric masking layer formed on that front surface, depositing a nickel plating on all silicon exposed by the etching, solder dipping or overplating the nickel with copper and tin, removing the remainder of the dielectric masking layer from the front surface, and providing an antireflection coating on the newly exposed portions of the front surface.

While such a procedure may be applied to either single crystal or polycrystalline silicon, cost considerations make it desirable to fabricate solar cells from the latter. However, as is well known, because of the minority carrier losses at grain boundaries, dislocations, and the like, the efficiencies achieved with polycrystalline silicon solar cells are generally poorer than those of monocrystalline cells. This circumstance has been improved upon by introducing a monovalent element, such as hydrogen, into the polycrystalline material to combine with the dangling bonds associated with the structural defects, thereby minimizing the minority carrier recombination loss.

A variety of manufacturing protocols have been developed to integrate a hydrogen passivation step into the volume manufacture of solar cells. For instance, as taught in U.S. patent application Ser. Nos. 563,061, 563,292, and 563,132, all filed Dec. 18, 1983, the hydrogen passivation may be incorporated into the manufacturing process so as to form a plating mask for the control of subsequent metallization of the front surface electrodes. Thus, as described in U.S. patent application Ser. No. 563,061, a preferred embodiment of the process described in detail therein as applied to the manufacture of silicon solar cells involves, inter alia, the following steps: (1) forming a plating mask of a dielectric material on the front surface of a shallow-junction silicon ribbon so as to leave exposed those areas of the silicon to be covered by the front surface electrode, (2) depositing a thin layer of nickel (or similar material) on the exposed silicon, thereby forming an initial metal layer in the electrode pattern, (3) removing the plating mask, thereby exposing the silicon between the initial metal layer of the front electrode, (4) hydrogen ion-beam passivating the junction side of the cell in such a way as to form, inter alia, a fresh plating mask on the silicon between the electrodes, (5) sintering the nickel to form in part a nickel silicide, (6) plating additional metal(s) onto the metal-covered portions of the cell, and (7) antireflection coating the exposed surface of the silicon. Thereafter, the silicon may be further processed, e.g. to prepare it for connection to electrical circuits. In an alternative process, the heating of the sample during passivation supplies at least part of the energy for the nickel sintering step. Related proceedures are taught in U.S. patent application Ser. Nos. 563,292 and 563,192.

The exact nature of the altered surface layer formed as a result of ion-beam passivation, and forming the plating mask, is not known. One possibility is that the layer is a damaged zone wherein the crystal structure has been somewhat disrupted, the silicon in part forming SiH or $SiH_2$ with hydrogen from the ion beam, yet wherein the material is possibly amorphous. It has also been suggested that carbon vapor or a hydrocarbon inevitably present in the vacuum system might form a dielectric layer on the silicon surface. Whatever its nature, it was found that a plating mask could be formed concurrently with the hydrogen passivation of EFG-grown silicon by a hydrogen ion beam of a Kaufman-type (broad beam) ion source.

As noted in all of the U.S. patent applications referred to above, a small amount of carbon or of one or more hydrocarbons appears to be necessary for the consistent formation of an altered surface layer of the desired quality. The quantity of carbon or hydrocarbon apparently necessary was also apparently readily available from the inevitable contaminants in the ion-beam vacuum system. Thus, the grid of the Kaufman-type ion source is typically of graphite. Also, as first used, the vacuum system was equipped with a graphite mounting stage about 5 inches (c. 13 cm) in diameter on which the substrates, typically 2 by 4 inches (5 by 10 cm) on a side, were centrally located. It was noted that when a silicon mounting stage was substituted for the graphite stage, the altered surface layer formed by the ion bombardment did not perform as a plating mask as consistently as when the graphite stage was employed. This observation gave rise to the hypothesis that carbon vapor or hydrocarbon produced, for instance, by the impact of the ion beam on the graphite stage might enter into the formation of the altered layer.

While the methods disclosed in the referenced U.S. patent applications resulted in simplified manufacturing processes, there was nevertheless an undesirable loss of partially finished cells with poor ion beam-formed plating masks. Even with the graphite stage, results were not completely consistent. The yield of substrates with suitable plating masks, while high, was not as high as was desired for economical production of cells.

OBJECTS OF THE INVENTION

Accordingly, a primary object is to provide an improved method of conducting hydrogen passivation so as to more consistently produce good ion beam-formed plating masks.

Still another object is to provide an improved method of achieving passivation-formed plating masks that can be used to facilitate metal plating of a variety of silicon solid state electronic devices, including but not limited to, solar cells.

A further object of the present invention is to provide a novel solar cell manufacturing process that can use relatively low cost silicon substrates and that provides an improved yield of silicon pieces with passivation-formed plating masks.

BRIEF DESCRIPTION OF THE INVENTION

These and other objects are met in the present invention wherein a controlled flow, greater in volume than the background level, of a low molecular weight hydrocarbon vapor is introduced into the vacuum system of the Kaufman-type ion source used for passivation. The amount of hydrocarbon introduced is between about one third of one percent and about ten percent, relative to the hydrogen flow, depending on the hydrocarbon.

It has been found that such a controlled introduction of hydrocarbon improves the yield of silicon pieces with adequate ion-formed plating masks. Thus, the present process reduces the cost of solar cell production, by reducing the number of unsuitable partially finished solar cells with unsuitable ionbeam formed masks for metal plating.

Other objects of the invention will in part be obvious and will in part appear hereinafter. The invention accordingly comprises the several steps and the relation of one or more of such steps with respect to each of the others which are exemplified in the following detailed disclosure, and the scope of the application of which will be indicated in the claims.

BRIEF DESCRIPTION OF THE DRAWING

For a fuller understanding of the nature and objects of the present invention, reference should be had to the following detailed description which is to be considered together with the accompanying drawing which illustrates a number of the steps involved in making solar cells according to a preferred form of the invention.

Throughout the drawing, like reference numbers refer to similar structure.

In the drawing, the thicknesses and depths of the several coatings and regions are not shown to scale nor exactly in accordance with their relative proportions, for convenience of illustration.

DETAILED DESCRIPTION OF THE INVENTION

Referring now to the drawing, the preferred embodiment of the invention relates to the production of solar cells from EFG grown P-type silicon ribbon. For this embodiment, there is provided as a starting piece a partially finished cell 1. Partially finished cell 1 has a substrate 2, preferably formed from a P-type conductivity silicon ribbon, one side (hereafter the "front side") of which has been provided with a relatively shallow junction 4 (i.e., a junction of between about 3,000 and about 7,000 Angstrom units deep), an N-type conductivity region 6, and a mask 8. Mask 8 is of a material (e.g., a dielectric) to which metals, such as nickel, will only poorly adhere, and is configured to expose portions of the front surface of substrate 2 in a pattern of a multi-fingered grid electrode (e.g., an electrode having the form illustrated in U.S. Pat. No. 3,686,036). The other side (hereafter the "rear side") of the substrate is preferably provided with a layer 10 of aluminum alloyed to the substrate and a P+ region 12. The P+ region 12 preferably has a depth of from about 1 to about 5 microns.

Partially finished cell 1 may be fabricated by any of a number of means well known in the art. For instance, junction 4 and region 6 may be formed in a P-type silicon substrate 2 by the diffusion of phosphorus, and mask 8 may be formed on the front surface thereof by photolithography or printing. Thus, for instance, a layer of phosphosilicate glass, formed as detailed in U.S. Pat. No, 4,152,824, may be used as a source for the phosphorous dopant, the glass layer then being appropriately masked and etched through in part using a buffered HF solution so as to form mask 8. Layer 10 and P+ region 12 may be formed by coating the rear side of the substrate with a layer of an aluminum paste comprising aluminum powder in a volatile organic vehicle, such as terpineol, that can be removed by evaporation, and then heating the substrate to remove any volatile or pyrolyzable organic components of the paste and to alloy the aluminum to the substrate and form the P+ region. However, other forms of substrate, junction, and rear electrode, and other methods of fabrication, may equally well be employed to provide partially finished cell 1.

Starting with such a prefabricated piece, both sides of the substrate are first plated with nickel, an adhesive deposition of nickel forming a nickel layer 14 on the back side of the piece over the entire area of aluminum layer 10, while the adhesive deposition of nickel on the front side forms a layer 16 directly on the surface of substrate 2 only on those areas exposed through mask 8. Plating of the nickel layers may be done in various ways. Preferably it is accomplished in accordance with a known nickel plating process, e.g., a process of the type described in U.S. Pat. No. 4,321,283 of Kirit Patel, et al. As a preliminary step, the cleaned silicon substrate surface is pre-activated with a suitable agent. This pre-activation procedure is desirable since often the silicon surface will not itself support the plating process, and any nickel plated on an untreated surface generally adheres thereto only poorly. Preferably, gold chloride is used as the activating agent, although platinum chloride, stannous chloride - palladium chloride, or other well known activators may be used, as described, for instance, in U.S. Pat. No. 3,489,603. Thereafter, both sides of the silicon ribbon are coated with a layer of nickel, preferably by immersing the ribbon in an aqueous bath of nickel sulfamate and ammonium fluoride at a pH of about 2.9 and at approximately room temperature for a period of about 2 to 6 minutes.

At this stage, mask 8 is stripped from substrate 2. Depending on the nature of the mask, this may be accomplished in any of a number of well-known ways, as, for instance, by the use of a buffered etch. As a result of the mask removal, the front surface of substrate 2 is exposed through a grid pattern formed of nickel layer 16.

Next, the cell is hydrogen passivated. A preferred method is to expose the front surface of substrate 2 (and nickel layer 16) to the hydrogen ion beam of a Kaufman-type (broad beam) ion source situated about 15 cm from the substrate. This ion source is preferably operated at a pressure of between about 1 and 50 millitorr (of hydrogen), with a hydrogen flow rate on the order of about 10 to 100 s.c.c. per minute, with a potential of about 1000 to 2000 volts d.c. between source and substrate, and with a beam current density of between about 1 and 3 milliampere/cm$^2$ at the substrate. An exposure time of between about 1 and about 4 minutes has been found adequate both to minimize the minority carrier recombination losses typically experienced with EFG-type silicon cells (providing a passivation zone some 20 to 80 microns deep, or about 100 times as deep as junction 4) while simultaneously providing an altered surface layer 18 approximately 200 Angstrom units deep on the exposed portions of substrate 2. To this point, the process is as described in U.S. patent application Ser. No. 563,061. It will be recognized that the alternative processes taught, for instance, in U.S. patent application Ser. Nos. 563,192 or 563,262 could also be used.

During passivation, up to about 10% by volume, relative to the hydrogen flow, of a low molecular weight hydrocarbon vapor is introduced into the ionbeam vacuum chamber. The desired percentage flow of hydrocarbon vapor depends on the hydrocarbon. In a preferred embodiment, the hydrocarbon is methane (CH$_4$), and its concentration, relative to the hydrogen, is preferably between about 2% and about 8%. Alternatively, it has been found that between about 2% and about 6% acetylene (C$_2$H$_2$) or between about 0.33% and about 1% ethylene (C$_2$H$_4$) may be used. It should be noted that these levels are in addition to (and substantially greater than) the unavoidable background levels of hydrocarbons commonly found as contaminants in vacuum systems. For instance, the most prevalent contaminating hydrocarbon, methane, has a typical background level of between about 0.2 and 1%.

The hydrocarbon may be introduced either in the hydrogen supply to the ion source, or via a separate gas supply line into the vacuum system. It has been found, however, that the introduction of the hydrocarbon leads to a shortened life of the filament cathode within the source.

It has been found that an altered surface layer 18 produced in accordance with this procedure with accelerating voltages between about 1000 and about2 2000 volts and exposure times as short as 1 minute is sufficient to prevent subsequent metallization of the substrate over altered layer 18.

Next, the substrate is heated in an inert or a nitrogen atmosphere to a temperature and for a time sufficient to sinter the nickel layers and cause the nickel layer 16 on the front side of the substrate to react with the adjacent silicon to form a nickel silicide ohmic contact. For this purpose, the substrate is preferably heated to a temperature of about 300° C. for between about 15 and about 40 minutes. This provides a nickel silicide layer 20 with a depth of about 300 Angstrom units at the interface between nickel layer 16 and substrate 2. The nickel layer 14 on the rear side forms an alloy with aluminum layer 10. The temperature of this sintering step should not greatly exceed 300° C., as higher temperatures lead to excessive penetration of nickel layer 16 into the silicon.

Following this, the nickel of layers 14 and 16 is subjected to etching with hot dilute nitric acid, followed by ultrasonic cleaning, to remove excess nickel from both sides of the substrate. The nickel etch not only removes excess nickel but also removes some of the nickel - aluminum alloy formed on the rear side of the substrate during the sintering step. After the nickel etch step, layer 14 is characterized by an nickel - aluminum alloy layer overlying aluminum electrode layer 10 while layer 16 is stripped to expose nickel silicide layer 20 corresponding to the preselected electrode grid pattern.

Thereafter nickel silicide layer 20 and the nickel - aluminum alloy layer 14 are respectively further metallized with one or more layers 22 and 24 to provide suitable contacts. In these metallization steps, altered surface layer 18 of substrate 2 acts as a plating mask to prevent metal from adhering to the surface of the substrate between the pattern of the already attached nickel silicide layer 20. Preferably but not necessarily, this additional metallization involves application of a second layer of nickel to layers 14 and 20 according to one of the methods known in the art. Immediately thereafter, one or more layers of copper are applied to the exposed nickel on both sides of the substrate so as to bond to the nickel layers and thereby protect them against oxidation and to insure a high conductivity. The copper may be applied by electrolytic plating. Thereafter the device may be subjected to other treatments for known purposes, e.g., layers of tin and solder may be applied successively over the previously applied metal layers.

Following metallization, the cell edges (not shown) are trimmed, and an anti-reflection coating 26 is applied to the front surface of the cell. This latter step may be accomplished by any of a number of known methods, such as by chemical vapor deposition or evaporation of, for instance, TiO$_2$. Alternatively, anti-reflection coating 26 may be formed by the plasma deposition of silicon nitride at a temperature of between about 150° C. and 250° C., as is well known in the art.

EXAMPLE 1

By way of example, solar cells were manufactured from EFG-grown silicon in accordance with the procedure detailed above, using methane as the hydrocarbon. Passivation was accomplished by exposing the sample pieces for 1 minute to a hydrogen ion beam produced by a Kaufmann-type ion source having an accelerating potential of 1700 eV and a beam current density at the sample of between 1.5 and 2.0 mA cm$^{-2}$. In passivating the different sample pieces various percentages of methane were introduced along with the hydrogen to make up a flow rate of the hydrogen-methane mix of about 30 sccm at a chamber pressure of between 35 and 40 mTorr. The percentage of methane was maintained constant for each sample.

After passivation, the cells were finished, and the quality of the mask formed by the passivation beam was judged on the basis of the subsequent plating and (undesired) overplating of the cells. The cells were also measured for efficiency, both with and without an antireflection coating. As a control, cells were manufactured as detailed above but without the passivation step. The results are presented in Table I.

TABLE I

| % CH$_4$ | Mask Quality | Efficiency % | |
|---|---|---|---|
| | | (a) | (b) |
| Untreated (Control) | — | 6.5 | 9.4 |
| 0% | Worst | 8.6 | 11.8 |
| 0.33 | Worst | — | — |
| 2 | Poor | 8.2 | 11.4 |
| 4 | Good | 8.4 | 11.5 |
| 8 | Good-fair | — | — |
| 10 | Bad (skip plating) | — | — |
| 30 | Bad (skip plating) | — | — |
| 100 | Bad (skip plating) | — | — |

(a) no AR coatings;
(b) with AR coatings.

On the basis of this data, it appears that a methane: hydrogen mix having between about 2 and 8% methane produces the best quality masks, without a significant deterioration in cell efficiency over those cells passivated with no added methane. The gain in efficiencies of the passivated cells over the untreated control is evident. This gain in efficiency appears to be little effected by the hydrocarbon concentration.

EXAMPLE 2

Samples of EFG grown silicon were hydrogen passivated as in Example 1, but with different low carbon hydrocarbons. The samples were finished and the mask quality of each was judged as in Example 1. The results are presented in Table II.

From the data in Table I and Table II, it appears that the best quality plating masks are obtained with a methane: hydrogen mix of between about 2 and about 8%.

For ethylene and acetylene, concentrations of about 0.33% for the former and about 2% for the latter appear optimal, but acceptable results are possible in the range of about 0.33% to about 1% for ethylene and in the range of about 2% to about 6% for acetylene.

It will be appreciated that this procedure, by increasing the quality of the plating mask formed by an ion-beam passivation step improves on the yield of usable pieces, thereby reducing costs.

TABLE II

TABLE II

| Hydrocarbon | % of Gasseous Mixture | | | |
|---|---|---|---|---|
| | 0 | 0.33 | 2 | 8 |
| $CH_4$ | Worst | Worst | Poor | Good-fair |
| $C_2H_4$ | Worst | Good | Poor | Worst (skip plating) |
| $C_2H_2$ | Worst | Worst | Fair-Moderate | Poor |

It will be understood that a number of modifications may be made to the process without departing from the scope of the invention herein descibed. Thus, while the preferred method detailed herein makes use of a removable plating mask for the initial metallization of the front surface, the initial mask being removed prior to passivation, the passivation step may be used to form the initial mask, as detailed in U.S. patent application Ser. Nos. 563,292 or 563,192.

Of course, the process provided by this invention is not limited to the production of solar cells from EFG substrates. Thus, for example, cast polycrystalline substrates, epitaxial silicon on metallurgical grade silicon, or fine grade polysilicon layers formed by chemical or physical vapor deposition can be used to form relatively high efficiency solar cells according to the present invention. Further, the process is applicable to single crystal silicon. Then, too, the process may be practiced with N-type as well as P-type material. Also, the invention may be applied to substrates other than ribbons or similar flat stock, e.g., circular pieces of material or substrates having arcuate or polygonal cross-section.

Further, the method might be employed in the fabrication of silicon Schottky barrier devices, the altered surface layer serving as a mask for the metallization. For such applications, it will be understood, the metal-substrate interface is the junction, and the substrate consequently would not be provided with a junction by diffusion of phosphorus or the like. Other specific applications of this invention are in the manufacture of silicon FET or MIS devices, where the passivated layer may act as a protective mask or as an insulating layer.

Since these and other changes may be made in the above processes without departing from the scope of the invention herein involved, it is intended that all matter contained in the above description or shown in the accompanying drawing shall be interepreted in an illustrative and not a limiting sense.

What is claimed is:

1. In a method for manufacturing silicon solid state electronic devices wherein silicon is passivated by subjecting it to hydrogen ion-beam implantation in a vacuum chamber, the improvement comprising introducing to the vacuum chamber a low molecular weight hydrocarbon vapor with a volume flow rate of between about 0.3% and about 10% that of the hydrogen volume flow rate.

2. The improvement according to claim 1 wherein said hydrocarbon is methane.

3. The improvement according to claim 2 wherein the concentration of said hydrocarbon is between about 2% and about 8%.

4. The improvement according to claim 1 wherein said hydrocarbon is ethylene.

5. The improvement according to claim 4 wherein the concentration of said hydrocarbon is about 0.33%.

6. The improvement according to claim 1 wherein said hydrocarbon is acetylene.

7. The improvement according to claim 6 wherein the concentration of said hydrocarbon is about 2%.

8. An improved method for manufacturing solar cells wherein polycrystalline silicon is passivated by subjecting it to hydrogen ion beam implantation in a vacuum chamber, into which hydrogen gas is fed, said improved method comprising the step of introducing to said vacuum chamber during the hydrogen beam implantation a low molecular weight hydrocarbon in vapor form with a volume flow rate not exceeding about 10% of the hydrogen volume flow rate.

9. The method of claim 8 wherein said hydrocarbon is methane and the volume rate of methane into said vacuum chamber ranges between about 2% and about 8% of the hydrogen volume flow rate into said chamber.

10. The method of claim 8 wherein said hydrocarbon is ethylene and the volume flow rate of ethylene into said vacuum chamber is equal to between about 0.33% and about 1% of the hydrogen flow rate into said chamber.

11. The method of claim 8 wherein said hydrocarbon is acetylene and the volume flow rate of acetylene into said vacuum chamber is equal to between about 2% about 6% of the hydrogen volume flow rate into said chamber.

12. An improved method of passivating a silicon substrate so as to form an altered surface layer that functions as a plating mask, comprising the steps of placing said substrate in a vacuum chamber, introducing hydrogen and a low molecular weight hydrocarbon into said vacuum chamber so that the flow rate of hydrocarbon is between about 0.33% and 10% of the volume flow rate of hydrogen, and subjecting said substrate to hydrogen ion beam implantation in the presence of said hydrocarbon.

* * * * *